US011243158B2

(12) United States Patent
Liu et al.

(10) Patent No.: US 11,243,158 B2
(45) Date of Patent: Feb. 8, 2022

(54) DETERMINING PRESENCE OF INTERNAL CORROSION WITHIN A ROTOR BLADE BY MEASURING MAGNETIC CHARACTERISTIC(S)

(71) Applicant: United Technologies Corporation, Farmington, CT (US)

(72) Inventors: Xuan Liu, Glastonbury, CT (US); Zhong Ouyang, Glastonbury, CT (US); Andrew DeBiccari, North Branford, CT (US); Nicholas M. LoRicco, Agawam, MA (US); William J. Brindley, Hebron, CT (US); Kathryn Macauley, Glastonbury, CT (US); Christopher J. Bischof, Southlake, TX (US)

(73) Assignee: Raytheon Technologies Corporation, Farmington, CT (US)

( * ) Notice: Subject to any disclaimer, the term of this patent is extended or adjusted under 35 U.S.C. 154(b) by 108 days.

(21) Appl. No.: 16/706,211

(22) Filed: Dec. 6, 2019

(65) Prior Publication Data
US 2021/0172859 A1 Jun. 10, 2021

(51) Int. Cl.
*G01R 33/00* (2006.01)
*G01N 17/04* (2006.01)
*B64F 5/60* (2017.01)
*B64D 27/12* (2006.01)
*G01R 33/12* (2006.01)

(52) U.S. Cl.
CPC .............. *G01N 17/04* (2013.01); *B64D 27/12* (2013.01); *B64F 5/60* (2017.01); *G01R 33/1223* (2013.01)

(58) Field of Classification Search
CPC ................ G01R 33/00; G01R 33/0035; G01R 33/0023; G01R 33/0017; G01R 31/3191; G01B 7/004; G01C 17/38; G06F 3/017; G06F 3/0346; G06F 3/012
See application file for complete search history.

(56) References Cited

U.S. PATENT DOCUMENTS

| 8,378,676 B2 | 2/2013 | Ceschini | |
| 8,395,378 B2 * | 3/2013 | Lawrence | G01N 27/902 324/238 |
| 2002/0130659 A1 * | 9/2002 | Wincheski | G01N 27/9006 324/235 |
| 2005/0200355 A1 * | 9/2005 | Hatcher | G01N 27/902 324/239 |
| 2014/0091785 A1 | 4/2014 | Wherritt | |

FOREIGN PATENT DOCUMENTS

DE 2619897 C3 8/1980
DE 102004030501 B4 10/2008

OTHER PUBLICATIONS

EP search report for EP20212302.2 dated Apr. 16, 2021.

* cited by examiner

*Primary Examiner* — Jermele M Hollington
*Assistant Examiner* — Taqi R Nasir
(74) *Attorney, Agent, or Firm* — Getz Balich LLC

(57) ABSTRACT

A method is provided that involves rotational equipment that includes a case and a first rotor blade within the case. During the method, a probe is arranged within the case adjacent the first rotor blade. A magnetic characteristic of the first rotor blade is measured using the probe. Presence of internal corrosion within the first rotor blade is determined based on the measured magnetic characteristic.

19 Claims, 6 Drawing Sheets

DETERMINING PRESENCE OF INTERNAL CORROSION WITHIN A ROTOR BLADE BY MEASURING MAGNETIC CHARACTERISTIC(S)

BACKGROUND OF THE DISCLOSURE

1. Technical Field

This disclosure relates generally to inspection methods and, more particularly, to measuring magnetic characteristic(s) of a component.

2. Background Information

Various methods are known in the art for inspecting components such as rotor blades of a gas turbine engine. Typically, for aircraft applications, these known methods require a gas turbine engine to be removed from a wing of an aircraft and at least partially disassembled such that a rotor blade may be removed and discretely inspected. Removing a gas turbine engine from an aircraft and disassembling that engine, however, is time consuming and expensive. There is a need in the art therefore for improved methods capable of decreasing time and expense for inspection of gas turbine engine components, particularly those components housed within a case of the gas turbine engine.

SUMMARY OF THE DISCLOSURE

According to an aspect of the present disclosure, a method is provided involving rotational equipment that includes a case and a first rotor blade within the case. During this method, a probe is arranged within the case adjacent the first rotor blade. A magnetic characteristic of the first rotor blade is measured using the probe. Presence of internal corrosion within the first rotor blade is determined based on the measured magnetic characteristic.

According to another aspect of the present disclosure, an inspection method is provided for rotational equipment that includes a case and a rotor within the case. During this method, a probe is arranged within the case adjacent the rotor. The rotor is rotated about an axis, where the rotor includes an array of rotor blades. A magnetic characteristic for each rotor blade in the array of rotor blades is measured using the probe. Whether or not there is internal corrosion within each rotor blade in the array of rotor blades is determined based on the measured magnetic characteristic.

According to still another aspect of the present disclosure, an inspection method is provided for rotational equipment that includes a case and a first rotor blade within the case. During this method, a magnetometer within the case is arranged adjacent the first rotor blade. Magnetic permeability of the first rotor blade is measured using the magnetometer. Presence of internal corrosion within the first rotor blade is identified based on the measured magnetic permeability.

During the method, a first rotor blade in the array of rotor blades may be further inspected where the first rotor blade was determined to have internal corrosion.

The rotational equipment may be a gas turbine engine for an aircraft propulsion system. The gas turbine engine may be configured on wing during the measuring of the magnetic characteristic.

The probe may be part of a magnetometer.

A probe of the magnetometer may be connected to an end of a borescope tool.

The borescope tool may be configured as or otherwise include a borescope camera.

A magnetometer may be provided that includes the probe.

The magnetic characteristic may be or include relative magnetic permeability.

The probe may be located adjacent a leading edge of the first rotor blade. The measuring may include measuring the magnetic characteristic of at least a portion of the first rotor blade along the leading edge.

The probe may be located adjacent a trailing edge of the first rotor blade. The measuring may include measuring the magnetic characteristic of at least a portion of the first rotor blade along the trailing edge.

The measured magnetic characteristic may be compared to a threshold to determine the presence of internal corrosion within the first rotor blade.

The method may include determining that the first rotor blade is suitable for continued service where the measured magnetic characteristic is less than a threshold.

The method may include determining that the first rotor blade is not suitable for continued service where the measured magnetic characteristic is greater than a threshold.

A rotor of the rotational equipment may be rotated at least until a second rotor blade is adjacent the probe. A second magnetic characteristic of the second rotor blade may be measured using the probe. Presence of internal corrosion within the second rotor blade may be determined based on the measured second magnetic characteristic.

The internal corrosion may include corrosion within an internal passage of the first rotor blade.

The rotational equipment may be a gas turbine engine.

The gas turbine engine may be installed with an aircraft during the measuring of the magnetic characteristic of the first rotor blade.

The first rotor blade may be configured as a turbine blade.

The probe may be moved along the first rotor blade. Magnetic characteristics may be measured at different regions along the first rotor blade using the probe. Presence of internal corrosion within the first rotor blade at one or more of the different regions may be measured based on the measured magnetic characteristics.

The present disclosure may include any one or more of the features disclosed above and/or below alone or in any combination thereof.

The foregoing features and the operation of the invention will become more apparent in light of the following description and the accompanying drawings.

DETAILED DESCRIPTION

The present disclosure includes systems and methods for at least inspecting one or more components within rotational equipment. An example of such rotational equipment is a gas turbine engine for an aircraft propulsion system, an exemplary embodiment of which is described below in further detail with respect to FIG. 6. The inspection system of the present disclosure, however, is not limited to such an aircraft application nor a gas turbine engine application. The inspection system, for example, may alternatively inspect one or more components within rotational equipment such as, but not limited to, an industrial gas turbine engine, a wind turbine or a water turbine.

Figure 1:
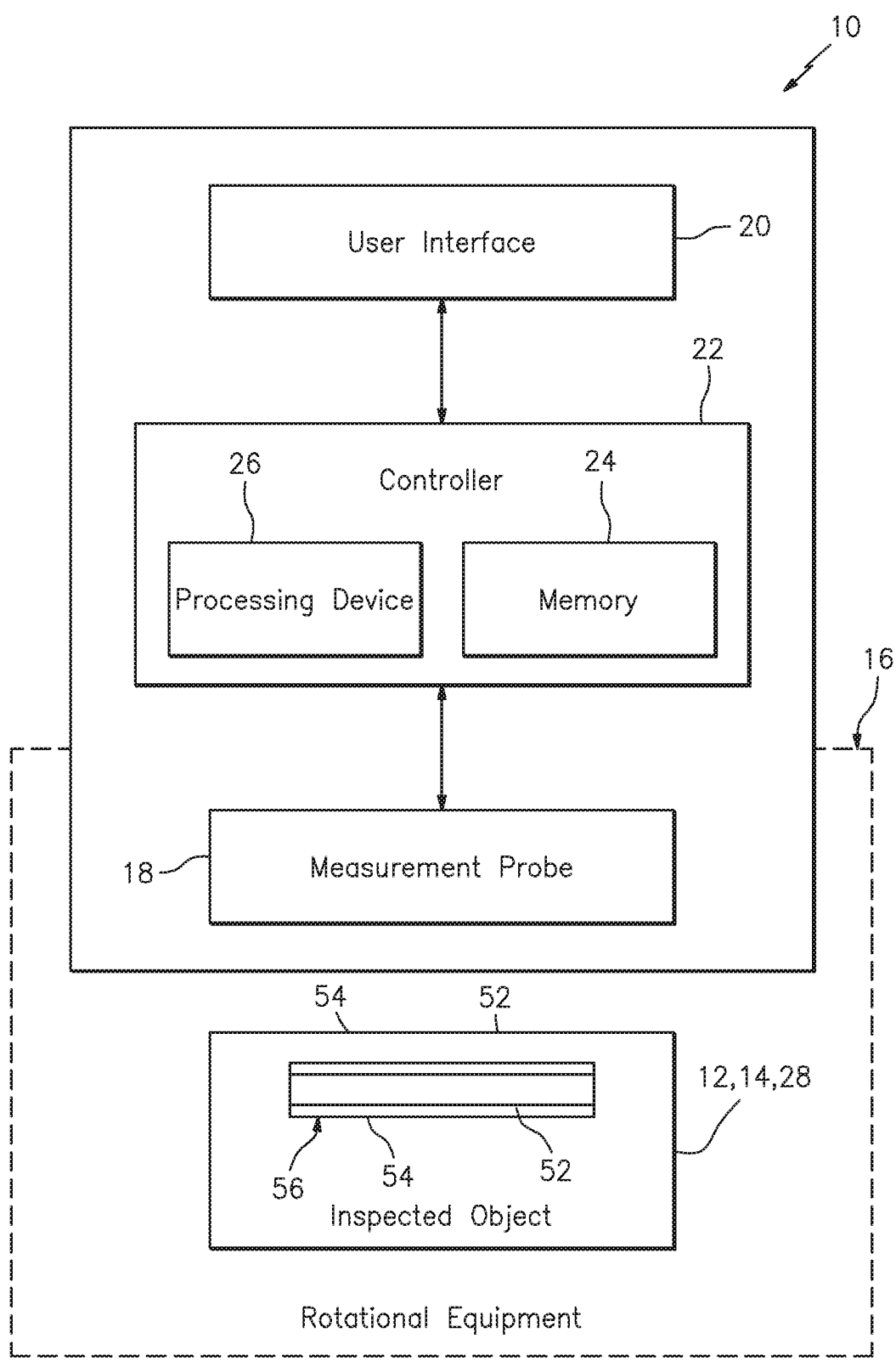
FIG. 1 is a schematic illustration of an inspection system inspecting a component within rotational equipment.

FIG. 1 illustrates an inspection system 10 configured for measuring at least one magnetic characteristic of at least one object 12. Here, the object 12 may be one of the components 14 within the rotational equipment 16. The magnetic characteristic is a measurable magnetic parameter such as, but not limited to, relative magnetic permeability.

The inspection system 10 of FIG. 1 includes a measurement probe 18, a user interface 20 and a controller 22. The measurement probe 18 is configured to sense the at least one magnetic characteristic. The measurement probe 18 is further configured to output probe data that is indicative of the sensed at least one magnetic characteristic. The measurement probe 18, for example, may be configured as a magnetometer that senses magnetic permeability of material and outputs probe data indicative of the sensed magnetic permeability. Various types and configurations of magnetometers and other suitable measurement probes are known in the art, and the present disclosure is not limited to any particular ones thereof.

The user interface 20 is configured to communicate information to a user; e.g., a human operator. The user interface 20, for example, may be operable to visually present the information and/or audibly present the information to the user. Examples of the user interface 20 include, but are not limited to, a display screen, a touch screen, a speaker or a combination thereof.

The controller 22 is configured in signal communication (e.g., hardwired and/or wirelessly coupled) with the measurement probe 18 and the user interface 20. The controller 22 may be implemented with a combination of hardware and software. The hardware may include memory 24 and at least one processing device 26, which processing device 26 may include one or more single-core and/or multi-core processors. The hardware may also or alternatively include analog and/or digital circuitry other than that described above.

The memory 24 is configured to store software (e.g., program instructions) for execution by the processing device 26, which software execution may control and/or facilitate performance of one or more operations such as those described in the methods below. The memory 24 may be a non-transitory computer readable medium. For example, the memory 24 may be configured as or include a volatile memory and/or a nonvolatile memory. Examples of a volatile memory may include a random access memory (RAM) such as a dynamic random access memory (DRAM), a static random access memory (SRAM), a synchronous dynamic random access memory (SDRAM), a video random access memory (VRAM), etc. Examples of a nonvolatile memory may include a read only memory (ROM), an electrically erasable programmable read-only memory (EEPROM), a computer hard drive, etc.

Figure 2:
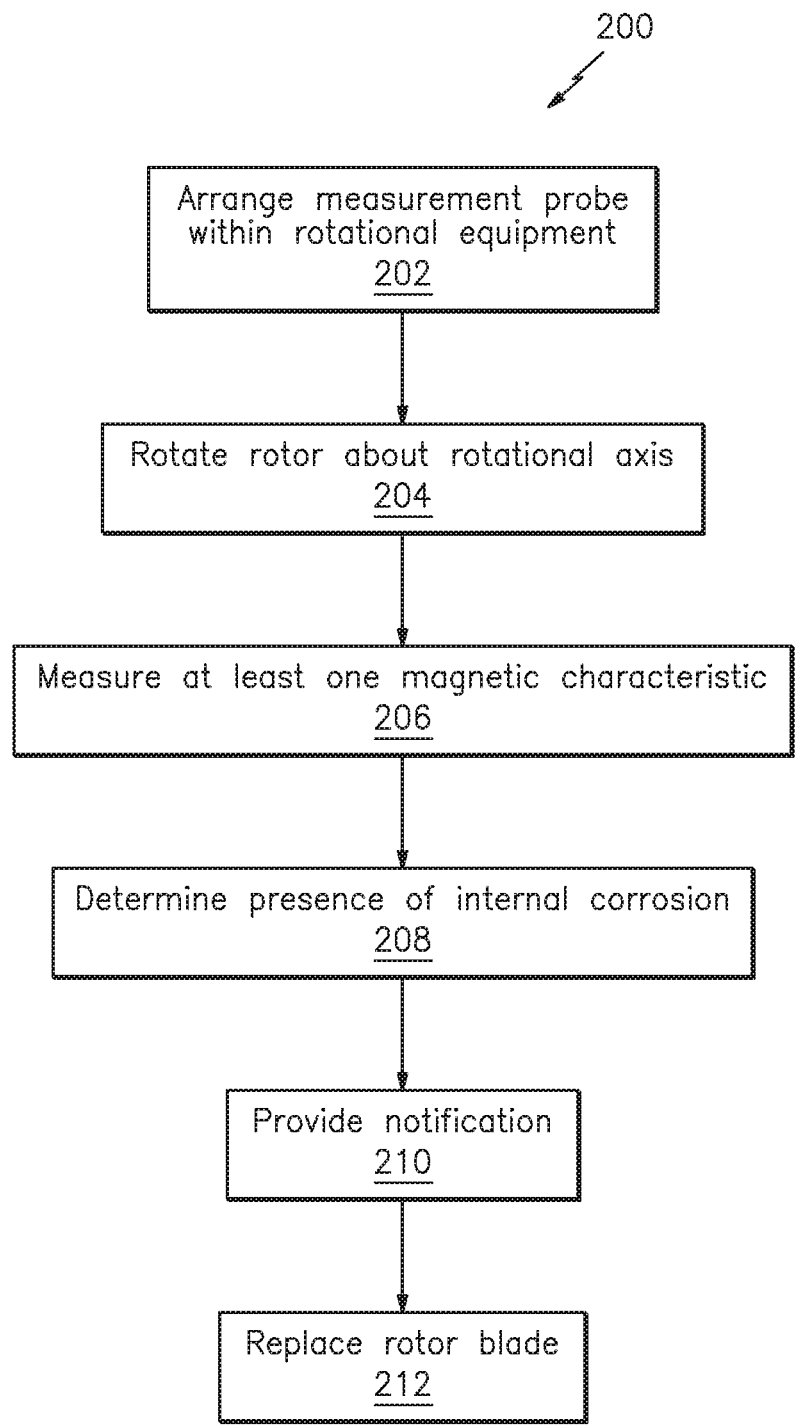
FIG. 2 is a flow diagram of a method involving rotational equipment.

FIG. 2 is a flow diagram of a method 200 involving the rotational equipment 16. During this method, at least one of the components 14 within the rotational equipment 16 is inspected, for example, to determine if the rotational equipment component(s) 14 are suitable (e.g., acceptable and/or meet a minimum threshold) for continued service/use within the rotational equipment 16. For ease of description, referring to FIG. 3, the components 14 are described below as rotor blades 28 in a rotor blade array of a rotor 30 positioned within a case 32 of the rotational equipment 16. The method 200, however, is not limited to such an exemplary application.

The method 200 may be performed using an inspection system such as the inspection system 10 of FIG. 1. The method 200, of course, may alternatively be performed using other inspection systems and/or inspection devices.

In step 202, the measurement probe 18 is arranged within the rotational equipment 16. The measurement probe 18, for example, may be arranged inside of the case 32 and next to the rotor 30. The measurement probe 18 of FIG. 3, for example, is located within an interior cavity 34 of the case 32 (e.g., within an annular flowpath of the rotational equipment 16) and at (e.g., on, adjacent or proximate) an upstream end 36 (or alternatively a downstream end 38; see FIG. 4) of the rotor 30. With this arrangement, the measurement probe 18 may be arranged at a leading edge 40 (or alternatively a trailing edge 42; see FIG. 4) of a respective one of the rotor blades 28 being investigated.

To arrange the measurement probe 18 within the case 32, the measurement probe 18 may be configured with a probe positioning device 44. The measurement probe 18, for example, may be secured to an end portion of a borescope inspection tool such as, but not limited to, a borescope camera 46. A borescope plug may be removed from a borescope inspection port 48 in the case 32, and the probe positioning device 44 may be inserted into the borescope inspection port 48 to arrange the measurement probe 18 as described above. The borescope camera 46 may be used to visually locate the measurement probe 18 at a probe inspection position within the case 32. Of course, other tools and/or methodologies may be utilized to arrange the measurement probe 18 within the case 32.

In step 204, the rotor 30 is rotated about its rotational axis 50 such that a respective one of the rotor blades 28 to be inspected (hereinafter "inspected rotor blade") is located next to the measurement probe 18. Alternatively, this step 204 may be skipped where, for example, the inspected rotor blade 28 is already located next to the measurement probe 18, or the measurement probe 18 is initially arranged to be located next to the inspected rotor blade 28.

In step 206, at least one magnetic characteristic of the inspected rotor blade 28 is measured. The controller 22, for example, may signal the measurement probe 18 to measure/sense a magnetic characteristic such as, but not limited to, magnetic permeability of material forming at least a portion of the inspected rotor blade 28. The measurement probe 18 may then output probe data indicative of the measured magnetic characteristic(s) to the controller 22 for further processing. The output probe data may also be communicated to a server and/or another storage device for archiving, statistical analysis, etc.

In step 208, presence of internal corrosion 52 within the inspected rotor blade 28 is determined. The controller 22, for example, processes the output data received from the measurement probe 18 to determine whether or not there is a minimum threshold of corrosion 52 within the rotor blade 28; e.g., a sign of internal corrosion 52.

The determination of the presence of internal corrosion 52 is facilitated by the phenomena that magnetic characteristics such as the magnetic permeability of rotor blade material may change as that material itself undergoes changes. For example, material of the inspected rotor blade 28 that forms a wall 54 of an internal passage 56 within that rotor blade 28 may be subject to corrosion 52 resulting from an interaction between the rotor blade material and cooling fluid (e.g., cooling air) flowing through the internal passage 56 during operation of the rotational equipment 16. Such internal corrosion 52 causes a change in the chemical composition of the rotor blade material. Such a change in the chemical composition of the rotor blade material may in turn cause a change in the magnetic characteristics (e.g., the magnetic permeability) of the rotor blade material. For example, internal corrosion within a metal superalloy (e.g., a nickel superalloy) rotor blade may change (e.g., increase) the magnetic permeability of the rotor blade material. In other words, the internal corrosion 52 may make the rotor blade material more ferromagnetic.

Utilizing the relationship between material changes and magnetic characteristic changes, the controller 22 may determine whether or not there is any or a minimum threshold (e.g., a sign) of internal corrosion 52 within the inspected rotor blade 28. The controller 22, for example, may compare the probe data and, more particularly, a value associated with the measured magnetic characteristic to a corrosion threshold. Where the measured magnetic characteristic value is equal to or greater than (or less than depending upon the specific magnetic characteristic) the corrosion threshold, the controller 22 may determine the presence of internal corrosion 52 within the inspected rotor blade 28. Conversely, where the measured magnetic characteristic value is less than (or greater than depending upon the specific magnetic characteristic) the corrosion threshold, the controller 22 may determine there is no, or an acceptable amount of, internal corrosion 52 within the inspected rotor blade 28.

Where internal corrosion 52 is detected within the inspected rotor blade 28, the controller 22 may further determine if the inspected rotor blade 28 is suitable for continued service within the rotational equipment 16. For example, where the measured magnetic characteristic value is equal to or greater than (or less than depending upon the specific magnetic characteristic) a replacement threshold, the controller 22 may determine that the inspected rotor blade 28 is no longer suitable for continued service within the rotational equipment 16; e.g., the inspected rotor blade 28 should be replaced. This replacement threshold may correspond to an amount of internal corrosion 52 that removes the inspected rotor blade 28 from of its design specification or allowed deviation therefrom. However, where the measured magnetic characteristic value is less than (or greater than depending upon the specific magnetic characteristic) the replacement threshold, the controller 22 may determine that the inspected rotor blade 28 is still suitable for continued service within the rotational equipment 16. Of course, the inspection system 10 may also predict a continued useful life for the inspected rotor blade 28 based on the specific measured magnetic characteristic value; e.g., by comparing that value to one or more intermediate thresholds.

In step 210, a notification is provided. For example, where it is determined that internal corrosion 52 is present within the inspected rotor blade 28, a positive indication for internal corrosion 52 may be presented to a user by the user interface 20. However, where it is determined that no, or an acceptable amount of, internal corrosion 52 is present within the inspected rotor blade 28, a negative indication for internal corrosion 52 may be presented to the user by the user interface 20. In addition or alternatively, where it is determined that inspected rotor blade 28 is no longer suitable for continued use within the rotational equipment 16, an indication that the inspected rotor blade 28 should be replaced may be presented to the user by the user interface 20. However, where it is determined that inspected rotor blade 28 is still suitable for continued use within the rotational equipment 16, an indication that the inspected rotor blade 28 does not need to be replaced may be presented to the user by the user interface 20.

In step 212, the inspected rotor blade 28 may be replaced where, for example, an indication is provided that internal corrosion 52 is present and/or the inspected rotor blade 28 is no longer suitable for service. Where the rotor blade 28 is replaced, the rotational equipment 16 may be partially disassembled.

One or more of the foregoing method steps may be repeated for one or more of the remaining rotor blades 28 of the rotor 30. For example, while the measurement probe 18 is still arranged within the case 32, the rotor 30 may be rotated about its rotational axis 50 such that a circumferentially neighboring rotor blade 28 is now arranged next to the measurement probe 18 for inspection. The steps 206, 208, 210 and/or 212 may be repeated for this neighboring rotor blade 28. This process may be continued iteratively until, for example, each rotor blade 28 in the rotor blade array has been inspected for internal corrosion 52. Alternatively, the process may be performed for a certain set of the rotor blades 28 (e.g., every other rotor blade 28, every third rotor blade 28, etc.) where, for example, a test sample is taken.

In some embodiments, the measurement probe 18 may be maintained in the same stationary position for the entire inspecting of a respective rotor blade 28. However, in other embodiments, the magnetic characteristic(s) may be measured at a plurality of different locations along the inspected rotor blade 28; e.g., at a plurality of locations along the leading and/or trailing edge 40, 42 of the inspected rotor blade 28. In still other embodiments, the magnetic characteristic(s) may be measured while the measurement probe 18 is slowly moved along the inspected rotor blade 28 to, for example, map the presence of internal corrosion 52 within the inspected rotor blade 28.

Figure 5:
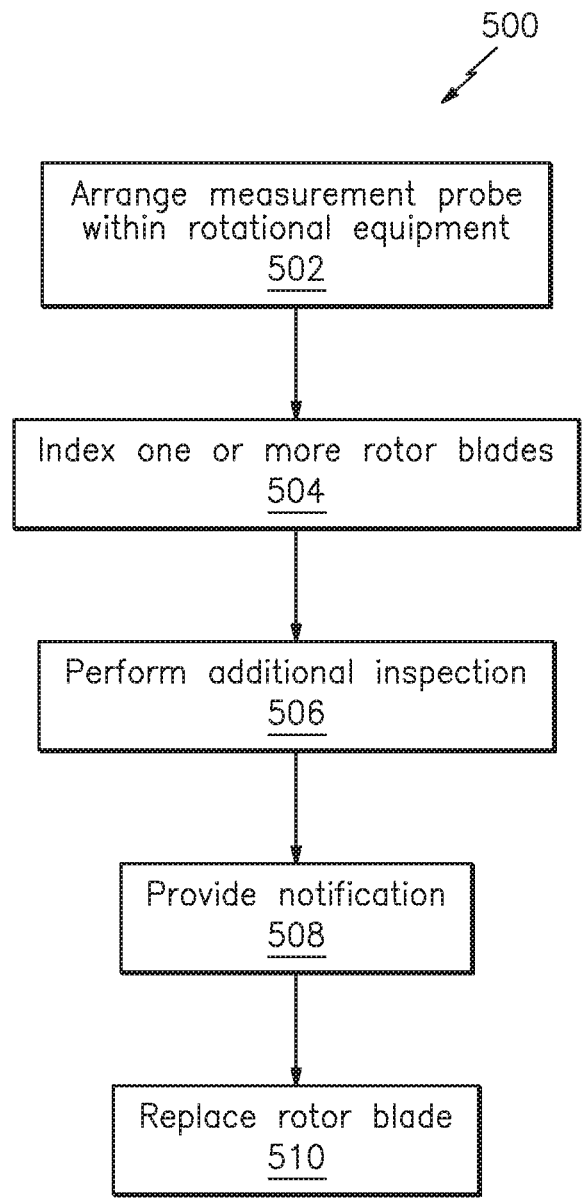
FIG. 5 is a flow diagram of another method involving rotational equipment.

FIG. 5 is a flow diagram of another method 500 involving the rotational equipment 16. In step 502, the measurement probe 18 is arranged within the rotational equipment 16, for example, as described above with respect to the step 202.

In step 504, one or more of the rotor blades 28 are indexed. The rotor 30, for example, may be rotated about its rotational axis 50 and iteratively/repeatedly stopped such that one or more or each of the rotor blades 28 in the rotor blade array is momentarily located and stationary at the measurement probe 18. While each respective rotor blade 28 is stationary next to the measurement probe 18, the inspection system 10 is operated to determine whether or not there is any sign of internal corrosion 52 within that rotor blade 28 at or near the investigated rotor blade portion; e.g., see the steps 206 and 208 above. The controller 22 may then track which rotor blade(s) 28 has signs of internal corrosion 52 and/or which rotor blade(s) 28 have no signs of internal corrosion 52. Those rotor blades 28 that have signs of internal corrosion 52 are identified (e.g., digitally marked) for further inspection.

In step 506, an additional (e.g., more in depth) inspection is performed for each of the rotor blade(s) 28 identified as having signs of internal corrosion 52. For example, the magnetic characteristic(s) in one or more additional portions of each of those rotor blades 28 may be measured to determine how much corrosion 52 is present within the internal passage(s) 56 using a similar process as described above with respect to the steps 206 and 208. The internal corrosion 52 may also be mapped for one or more or each of the rotor blades 28.

In step 508, a notification may be provided for each of the rotor blades 28 which undergoes the additional inspection. This notification may be provided as describe above in the step 210.

In step 510, the inspected rotor blade(s) 28 may be replaced where, for example, an indication is provided that the inspected rotor blade(s) 28 is/are no longer suitable for continued service. Where the rotor blade(s) 28 are replaced, the rotational equipment 16 may be partially disassembled.

In some embodiments, the rotational equipment 16 may be configured as a gas turbine engine. In such embodiments, the rotor blades 28 may be configured as compressor blades within a compressor section of the gas turbine engine. Alternatively, the rotor blades 28 may be configured as turbine blades within a turbine section of the gas turbine engine.

In some embodiments, the methods 200 and/or 500 may be performed while the gas turbine engine is still configured with an aircraft. The methods 200 and/or 500, for example, may be performed while the gas turbine engine is still on wing; e.g., mounted to a wing of the aircraft. This enables the rotor blades 28 within the gas turbine engine to be inspected without costly and time consuming engine removal and/or disassembly processes. Furthermore, by reducing the cost and time for rotor blade inspections, such inspections may be performed more frequently without significantly disrupting scheduling for the aircraft.

Figure 6:
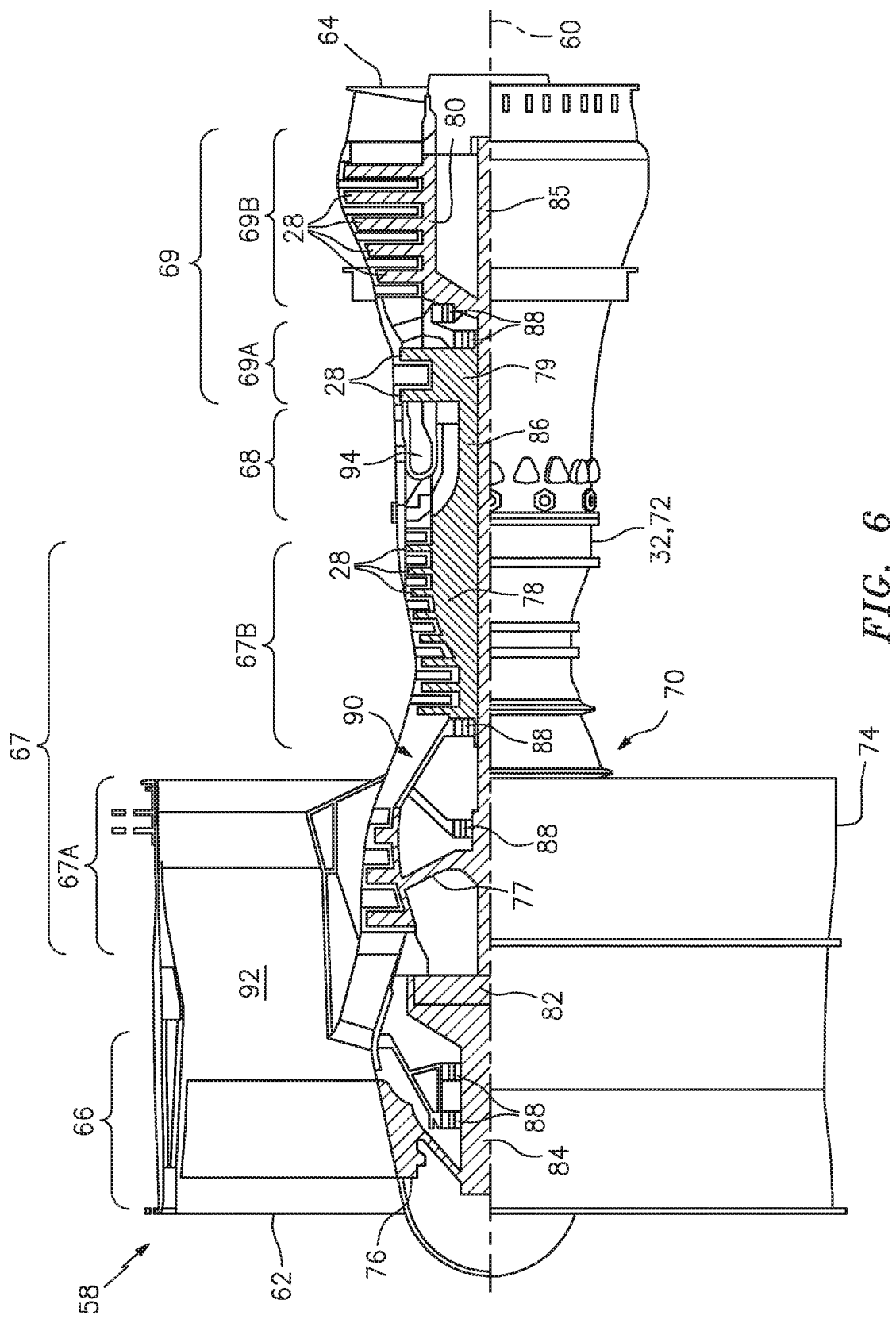
FIG. 6 is a side cutaway illustration of a geared turbine engine.

FIG. 6 is a side cutaway illustration of a geared turbine engine 58 which may include the rotor blades 28. This turbine engine 58 extends along an axial centerline 60 (e.g., the rotational axis 50) between an upstream airflow inlet 62 and a downstream exhaust 64. The turbine engine 58 includes a fan section 66, a compressor section 67, a combustor section 68 and a turbine section 69. The compressor section 67 includes a low pressure compressor (LPC) section 67A and a high pressure compressor (HPC) section 67B. The turbine section 69 includes a high pressure turbine (HPT) section 69A and a low pressure turbine (LPT) section 69B.

The engine sections 66-69 are arranged sequentially along the centerline 60 within an engine housing 70. This housing 70 includes an inner case 72 (e.g., a core case) and an outer case 74 (e.g., a fan case). The inner case 72 may house one or more of the engine sections 67-69; e.g., an engine core. The inner case 72 may be configured as or otherwise include the case 32. The outer case 74 may house at least the fan section 66.

Figure 3:
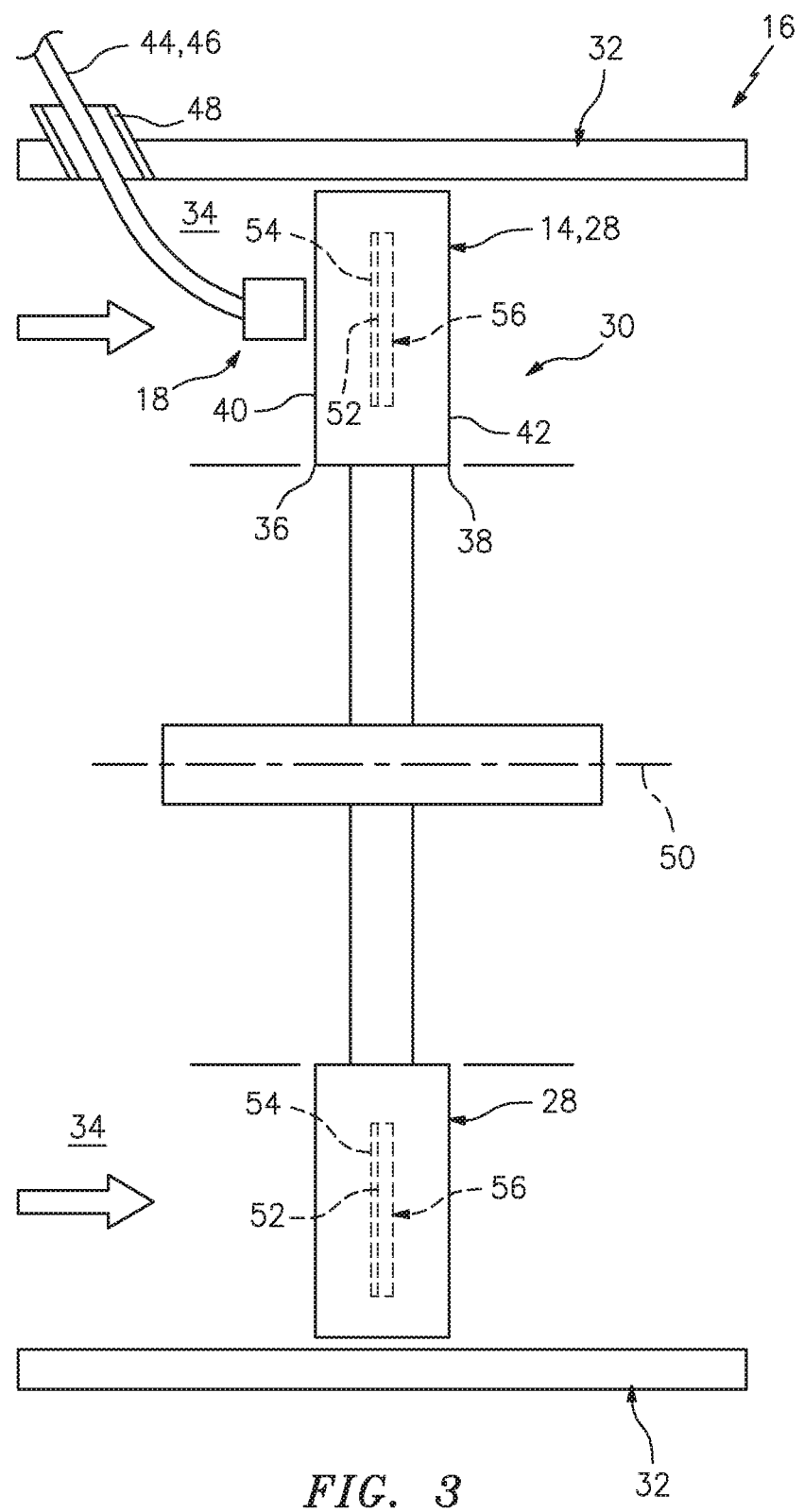
FIG. 3 is a schematic illustration of a measurement probe measuring magnetic characteristic(s) of a component within the rotational equipment.
Figure 4:
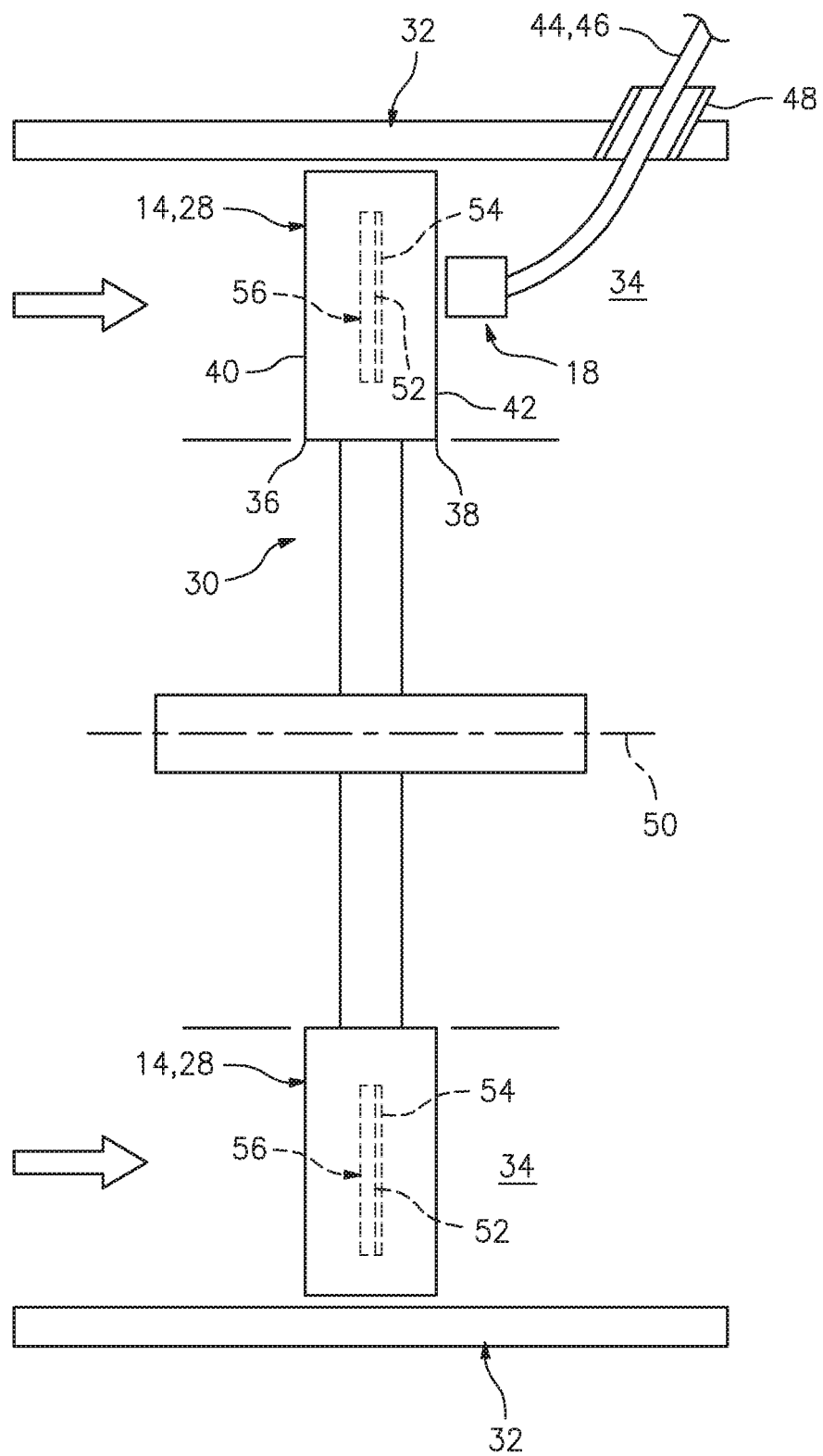
FIG. 4 is another schematic illustration of the measurement probe measuring magnetic characteristic(s) of the component within the rotational equipment.

Each of the engine sections 66, 67A, 67B, 69A and 69B includes a respective rotor 76-80; e.g., the rotor 30 of FIG. 3 or 4. Each of these rotors 76-80 includes a plurality of rotor blades (e.g., the rotor blades 28) and one or more rotor disks, where the rotor blades are respectively arranged circumferentially around and connected to the respective rotor disk. The rotor blades 28, for example, may be formed integral with or mechanically fastened, welded, brazed, adhered and/or otherwise attached to the respective rotor disk(s).

The fan rotor 76 is connected to a gear train 82, for example, through a fan shaft 84. The gear train 82 and the LPC rotor 77 are connected to and driven by the LPT rotor 80 through a low speed shaft 85. The HPC rotor 78 is connected to and driven by the HPT rotor 79 through a high speed shaft 86. The shafts 84-86 are rotatably supported by a plurality of bearings 88; e.g., rolling element and/or thrust bearings. Each of these bearings 88 is connected to the engine housing 70 by at least one stationary structure such as, for example, an annular support strut.

During operation, air enters the turbine engine 58 through the airflow inlet 62. This air is directed through the fan section 66 and into a core gas path 90 and a bypass gas path 92. The core gas path 90 extends sequentially through the engine sections 67A-69B. The air within the core gas path 90 may be referred to as "core air". The bypass gas path 92 extends through a bypass duct, which bypasses the engine core. The air within the bypass gas path 92 may be referred to as "bypass air".

The core air is compressed by the compressor rotors 77 and 78 and directed into a combustion chamber 94 of a combustor in the combustor section 68. Fuel is injected into the combustion chamber 94 and mixed with the compressed core air to provide a fuel-air mixture. This fuel air mixture is ignited and combustion products thereof flow through and sequentially cause the turbine rotors 79 and 80 to rotate. The rotation of the turbine rotors 79 and 80 respectively drive rotation of the compressor rotors 78 and 77 and, thus, compression of the air received from a core airflow inlet. The rotation of the turbine rotor 80 also drives rotation of the fan rotor 76, which propels bypass air through and out of the bypass gas path 92. The propulsion of the bypass air may account for a majority of thrust generated by the turbine engine 58, e.g., more than seventy-five percent (75%) of engine thrust. The turbine engine 58 of the present disclosure, however, is not limited to the foregoing exemplary thrust ratio.

The case 32 and the rotor 30 of FIGS. 3 and 4 may be included in various turbine engines other than the one described above as well as in other types of rotational equipment. The case 32 and the rotor 30, for example, may be included in a geared turbine engine where a gear train connects one or more shafts to one or more rotors in a fan section, a compressor section and/or any other engine section. Alternatively, the case 32 and the rotor 30 may be included in a turbine engine configured without a gear train. The case 32 and the rotor 30 may be included in a geared or non-geared turbine engine configured with a single spool, with two spools (e.g., see FIG. 6), or with more than two spools. The turbine engine may be configured as a turbofan engine, a turbojet engine, a propfan engine, a pusher fan engine or any other type of turbine engine. The present disclosure therefore is not limited to any particular types or configurations of turbine engines or rotational equipment.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:

1. A method involving rotational equipment that includes a case and a first rotor blade within the case, the method comprising:
arranging a probe within the case adjacent the first rotor blade;
measuring relative magnetic permeability of the first rotor blade using the probe; and determining presence of internal corrosion within the first rotor blade based on the measured relative magnetic permeability.

2. The method of claim 1, further comprising providing a magnetometer that comprises the probe.

3. The method of claim 1, wherein
the probe is located adjacent a leading edge of the first rotor blade; and
the measuring comprises measuring the relative magnetic permeability of at least a portion of the first rotor blade along the leading edge.

4. The method of claim 1, wherein
the probe is located adjacent a trailing edge of the first rotor blade; and
the measuring comprises measuring the relative magnetic permeability of at least a portion of the first rotor blade along the trailing edge.

5. The method of claim 1, further comprising comparing the measured relative magnetic permeability to a threshold to determine the presence of internal corrosion within the first rotor blade.

6. The method of claim 1, further comprising determining that the first rotor blade is suitable for continued service where the measured relative magnetic permeability is less than a threshold.

7. The method of claim 1, further comprising determining that the first rotor blade is not suitable for continued service where the measured relative magnetic permeability is greater than a threshold.

8. The method of claim 1, further comprising:
rotating a rotor of the rotational equipment at least until a second rotor blade is adjacent the probe;
measuring a second relative magnetic permeability of the second rotor blade using the probe; and
determining presence of internal corrosion within the second rotor blade based on the measured second relative magnetic permeability.

9. The method of claim 1, wherein the internal corrosion comprises corrosion within an internal passage of the first rotor blade.

10. The method of claim 1, wherein the rotational equipment is a gas turbine engine.

11. The method of claim 10, wherein the gas turbine engine is installed with an aircraft during the measuring of the relative magnetic permeability of the first rotor blade.

12. The method of claim 1, wherein the first rotor blade is configured as a turbine blade.

13. The method of claim 1, further comprising
moving the probe along the first rotor blade;
measuring relative magnetic permeabilities at different regions along the first rotor blade using the probe; and
determining presence of internal corrosion within the first rotor blade at one or more of the different regions based on the measured relative magnetic permeabilities.

14. An inspection method for rotational equipment that includes a case and a rotor within the case, the inspection method comprising:
arranging a probe within the case adjacent the rotor;
rotating the rotor about an axis, wherein the rotor includes an array of rotor blades;
measuring relative magnetic permeability for each rotor blade in the array of rotor blades using the probe; and
determining whether or not there is internal corrosion within each rotor blade in the array of rotor blades based on the measured relative magnetic permeability.

15. The inspection method of claim 14, further comprising further inspecting a first rotor blade in the array of rotor blades where the first rotor blade was determined to have internal corrosion.

16. The inspection method of claim 14, wherein
the rotational equipment is a gas turbine engine for an aircraft propulsion system; and
the gas turbine engine is configured on wing during the measuring of the relative magnetic permeability.

17. The inspection method of claim 14, wherein the probe is part of a magnetometer.

18. An inspection method for rotational equipment that includes a case and a first rotor blade within the case, the inspection method comprising:
arranging a magnetometer within the case adjacent the first rotor blade;
measuring magnetic permeability of the first rotor blade using the magnetometer; and
identifying presence of internal corrosion within the first rotor blade based on the measured magnetic permeability.

19. The inspection method of claim 18, wherein a probe of the magnetometer is connected to an end of a borescope tool.

* * * * *